(12) United States Patent
Lasch et al.

(10) Patent No.: US 9,462,377 B2
(45) Date of Patent: Oct. 4, 2016

(54) SYSTEMS AND METHODS FOR OPTIMIZING AN AUDIO COMMUNICATION SYSTEM

(71) Applicant: Continental Automotive Systems, Inc., Auburn Hills, MI (US)

(72) Inventors: Jonathan Michael Lasch, Northbrook, IL (US); Edward Srenger, Schaumburg, IL (US); David L. Barron, Scottsdale, AZ (US)

(73) Assignee: Continental Automotive Systems, Inc., Auburn Hills, MI (US)

(*) Notice: Subject to any disclaimer, the term of this patent is extended or adjusted under 35 U.S.C. 154(b) by 0 days.

(21) Appl. No.: 14/493,535

(22) Filed: Sep. 23, 2014

(65) Prior Publication Data

US 2015/0010162 A1   Jan. 8, 2015

Related U.S. Application Data

(62) Division of application No. 12/405,245, filed on Mar. 17, 2009, now abandoned.

(51) Int. Cl.
| | |
|---|---|
| *H03G 3/32* | (2006.01) |
| *H04R 3/00* | (2006.01) |
| *H03G 3/24* | (2006.01) |
| *H03G 3/02* | (2006.01) |

(52) U.S. Cl.
CPC ............... *H04R 3/002* (2013.01); *H03G 3/24* (2013.01); *H03G 3/32* (2013.01); *H03G 3/02* (2013.01); *H04R 2499/13* (2013.01)

(58) Field of Classification Search
CPC .... H04R 3/002; H04R 2489/13; H04R 3/00; H04R 3/04; H04R 9/08; H03G 3/32; H03G 3/02; H03G 5/16; H03G 3/24
See application file for complete search history.

(56) References Cited

U.S. PATENT DOCUMENTS

| | | | |
|---|---|---|---|
| 5,907,622 A | 5/1999 | Dougherty | |
| 6,175,602 B1* | 1/2001 | Gustafsson | ......... G10L 21/0208 375/285 |
| 2005/0015252 A1 | 1/2005 | Marumoto | |
| 2005/0213776 A1* | 9/2005 | Honji | ...................... H03G 5/165 381/86 |
| 2006/0088175 A1 | 4/2006 | Eid et al. | |
| 2009/0063143 A1* | 3/2009 | Schmidt | .............. G10L 21/0208 704/233 |
| 2010/0304704 A1* | 12/2010 | Najafi | .................... H01Q 1/242 455/404.1 |

FOREIGN PATENT DOCUMENTS

| | | |
|---|---|---|
| EP | 1575163 A2 | 9/2005 |
| WO | 02091798 A2 | 11/2002 |

OTHER PUBLICATIONS

International Search Report for the PCT/US2010/027388 dated May 6, 2010.

* cited by examiner

*Primary Examiner* — Galina Yushina

(57) ABSTRACT

Methods and systems for optimizing and audio communication system, including detecting a surrounding noise profile, determining one or more states of one or more noise-related conditions corresponding to the surrounding noise profile, and associating the one or more states of the one or more noise-related conditions to the surrounding noise profile.

9 Claims, 6 Drawing Sheets

SYSTEMS AND METHODS FOR OPTIMIZING AN AUDIO COMMUNICATION SYSTEM

I. BACKGROUND

The invention relates generally to the field of optimizing the performance of audio communication systems against noise interference.

II. SUMMARY

In one respect, disclosed is a method for optimizing an audio communication system, the method comprising: detecting a surrounding noise profile; determining one or more states of one or more noise-related conditions corresponding to the surrounding noise profile; and associating the one or more states of the one or more noise-related conditions to the surrounding noise profile.

In another respect, disclosed is a system for optimizing an audio communication system, the system comprising: one or more processors; one or more memory units coupled to the one or more processors; one or more microphones coupled to the one or more processors and memory; and one or more sensors coupled to the one or more processors and memory, the microphones being configured to detect a surrounding noise profile, the sensors being configured to determine one or more states of one or more noise-related conditions corresponding to the surrounding noise profile; and the system being configured to associate the one or more states of the one or more noise-related conditions to the surrounding noise profile.

In yet another respect, disclosed is a computer program product stored on a computer operable medium, the computer program product comprising software code being effective to optimize an audio communication system by being effective to: cause detection of a surrounding noise profile; determine one or more states of one or more noise-related conditions corresponding to the surrounding noise profile; and associate the one or more states of the one or more noise-related conditions to the surrounding noise profile.

Numerous additional embodiments are also possible.

III. BRIEF DESCRIPTION OF THE DRAWINGS

Other objects and advantages of the invention may become apparent upon reading the detailed description and upon reference to the accompanying drawings.

Figure 1:
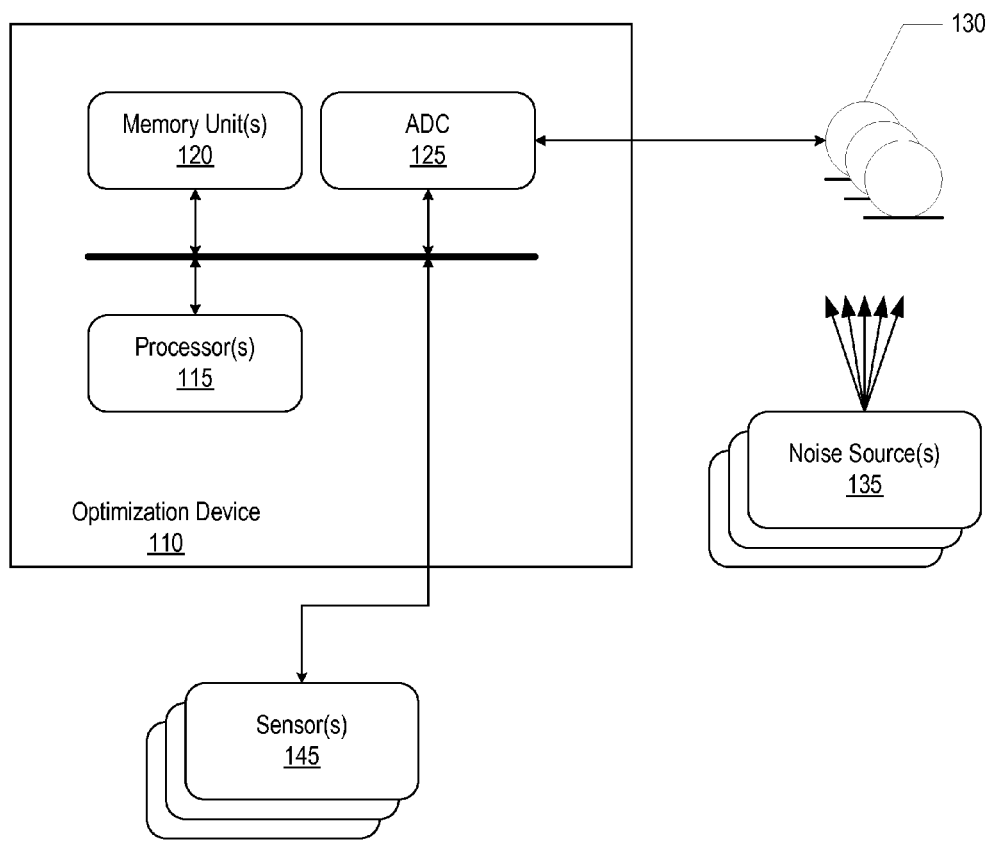
FIG. 1 is a block diagram illustrating a system for optimizing the performance of an audio communication system, in accordance with some embodiments.

While the invention is subject to various modifications and alternative forms, specific embodiments thereof are shown by way of example in the drawings and the accompanying detailed description. It should be understood, however, that the drawings and detailed description are not intended to limit the invention to the particular embodiments. This disclosure is instead intended to cover all modifications, equivalents, and alternatives falling within the scope of the present invention as defined by the appended claims.

IV. DETAILED DESCRIPTION

One or more embodiments of the invention are described below. It should be noted that these and any other embodiments are exemplary and are intended to be illustrative of the invention rather than limiting. While the invention is widely applicable to different types of systems, it is impossible to include all of the possible embodiments and contexts of the invention in this disclosure. Upon reading this disclosure, many alternative embodiments of the present invention will be apparent to persons of ordinary skill in the art.

In some embodiments, systems and methods for optimizing the performance of an audio communication system are disclosed. A surrounding noise profile may be determined by monitoring surrounding noise. In one embodiment, one or more microphones coupled to an analog-to-digital converter, for example, may be used to capture the noise profile. In some embodiments, the noise profile may be stored as samples of energy values over time, for example. Other methods of storing the noise profile may also be used.

In some embodiments, a set of states of one or more noise-related conditions corresponding to the surrounding noise profile may be determined. In some embodiments, the states of the noise-related conditions may be monitored substantially concurrently to the detection of the corresponding surrounding noise profile. Noise-related conditions may be any conditions that contribute to noise generation. In embodiments where the audio performance is implemented in an automobile, for example, noise-related conditions and the states of these conditions may include: location of the vehicle, date and time, position of each window in the car, position of the top in convertible cars, position of the sunroof, speed of the vehicle, engine RPMs, volume of the in-car radio, surrounding traffic, etc. In some embodiments, the surrounding noise profile may be stored with the corresponding noise-related conditions to create a database of surrounding noise profiles and corresponding noise-related conditions.

In some embodiments, either in real time or at a later time, audio communication system parameters corresponding to the surrounding noise profiles may be computed. In some embodiments, the audio communication system parameters may be stored in the database and associated with the corresponding surrounding noise profile and corresponding states of noise-related conditions. In some embodiments, the audio communication system parameters may be stored in the database in addition to the surrounding noise profile or instead of the surrounding noise profile being stored in the database.

Audio communication system parameters may include parameters for optimizing acoustic echo cancellers, equalizers, voice activity detectors, noise suppression, automatic gain control, etc. It should be noted that these parameters may be applied to optimize the performance of communication quality of an audio communication system, or the one or more speakers of an audio communication system, or both. It should also be noted that the optimization parameters may also be applied to communication systems that include only microphones or only speakers. For example, the optimization parameters may be applied to a radio system to optimize the performance of the radio's speakers or the optimization parameters may be applied to a note recording device to optimize the performance of the recording device's sound quality.

In some embodiments, the database may be used at a later time to increase the speed with which audio optimization is performed. In some embodiments, audio communication system parameters from the database may be used as initial audio communication system parameters. The initial audio communication system parameters used may be chosen in response to determining the states of the noise-related conditions. As stated above, if the system is being utilized in a vehicle, noise-related conditions may include the location of the vehicle, date and time, position of each window in the car, position of the top in convertible cars, position of the sunroof, speed of the vehicle, engine RPMs, intensity of the in-car radio, etc.

In some embodiments, if the database does not contain a match or a near match for the states of the noise-related conditions interpolation/extrapolation, etc. techniques may be used to obtain the best estimate for the audio communication system parameters that match the current states of the noise-related conditions.

FIG. 1 is a block diagram illustrating a system for optimizing the performance of an audio communication system, in accordance with some embodiments.

In some embodiments, optimization device 110 comprises one or more processors 115 coupled to one or more memory units 120. Processors 110 and memory units 120 are configured to process/store instructions and data in order to effect the optimization function of optimization device 110. Analog-to-digital converter 125 is configured to couple one or more microphones 130 to memory units 120 and processors 115. Additional devices, such as amplifiers, may be used to enable the functionality of microphones 130.

In some embodiments, microphones 130 are configured to detect a surrounding noise profile created by noise sources 135. Noise sources 135 may be any source of noise. In an embodiment where the audio communication system device is implemented in an automobile, for example, noise sources may include road noise, tire noise, engine noise, general wind noise, wind noise from windows being open, wind noise from a convertible top being open, radio volume level, etc. In an embodiment where the audio communication system device is implemented in a house, for example, noise sources may include appliances, stereo equipment, etc.

Sensors 145, which are also coupled to processors 115 and memory units 120, are configured to detect the states of one or more noise-related conditions substantially concurrently with microphones 130 detecting a surrounding noise profile. In an embodiment where the device is implemented in a vehicle, for example, the states of noise-related conditions may include location of the vehicle, time and date, windows' positions, convertible top position, speed of the vehicle, engine RPMs, radio volume, etc. Thus, sensors 145 may include GPS or other positioning devices, clock devices, door and windows sensors, engine sensors for speed and RPM information, stereo sensors for volume information, etc. In an embodiment where the device is implemented in a house, for example, the states of noise-related conditions may include stereo volume, dryer state, washer state, microwave state, location of device relative to the noise sources, etc.

In some embodiments, the detected surrounding sound profile and corresponding noise-related conditions may be stored in memory for later use. In alternative embodiments, audio communication system parameters corresponding to the surrounding noise profiles may be also be computed and stored. In some embodiments, the audio communication system parameters may be stored in a database and correlated with the corresponding states of the noise-related conditions. In some embodiments, the database may be created in memory units 220. In some embodiments, the audio communication system parameters and corresponding states of noise-related conditions may be stored instead of the surrounding noise profile in the database. In other embodiments, both the surrounding noise profile and the audio communication system parameters along with the corresponding states of the noise-related conditions may be stored in the database. In other embodiments, corresponding audio communication system parameters may be computed and added to the database at a later time.

Figure 2:
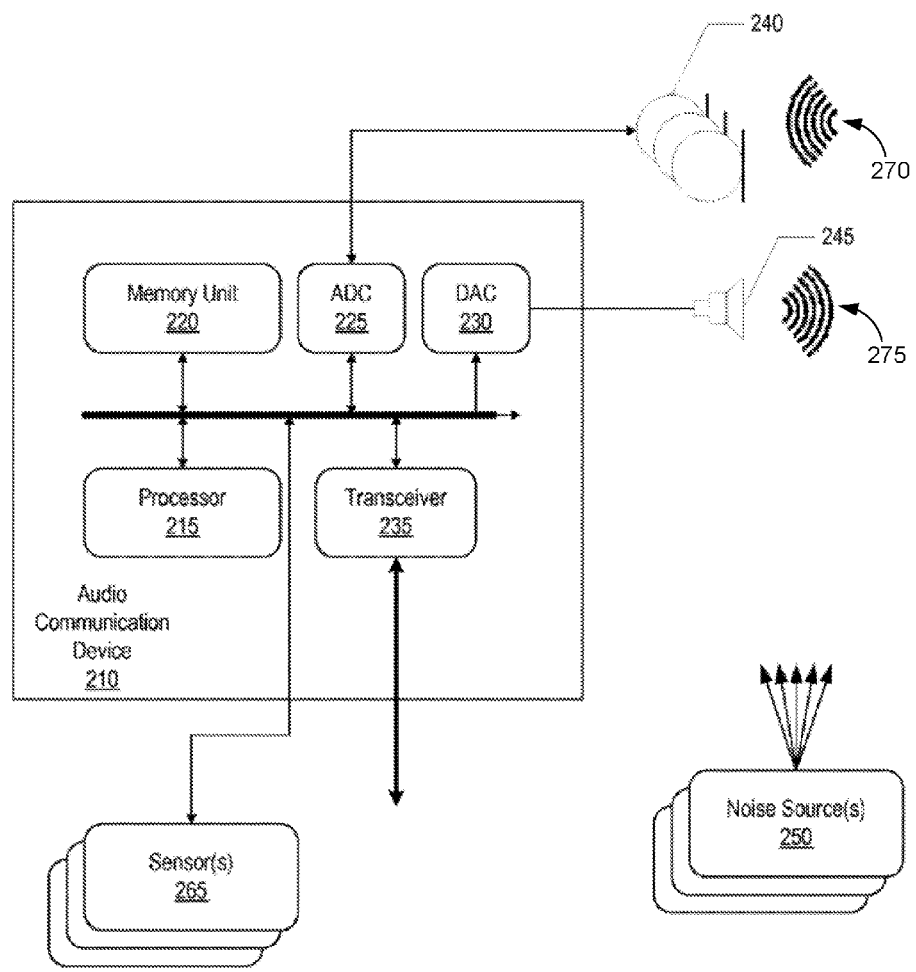
FIG. 2 is a block diagram illustrating an alternative system for optimizing the performance of an audio communication system, in accordance with some embodiments.

FIG. 2 is a block diagram illustrating an alternative system for optimizing the performance of an audio communication system, in accordance with some embodiments.

In some embodiments, audio communication device 210 comprises one or more processors 215 coupled to one or more memory units 220. Processors 215 and memory units 220 are configured to process/store instructions and data in order to effect the functionality of audio communication device 210. Analog-to-digital converter 225 is configured to couple one or more microphones 240 to memory units 220 and processors 215. Digital-to-analog converter 230 is configured to couple one or more speakers 245 to memory units 220 and processors 215. Additional coupling devices, such as amplifiers, may be used to couple microphones 240 and speakers 245.

In some embodiments, transceiver 235 is configured to transmit and receive audio signals from/to microphones 240 and speakers 245 to/from corresponding microphones and speakers in other similar communication devices. The communication may occur over a variety of media such the cellular network, the internet, radio waves, sound waves, etc.

In some embodiments, audio communication device 210 is configured to optimize the performance of audio communication device 210 as it may be affected by noise sources 250. In an embodiment where audio communication device 210 is implemented in a vehicle, noise sources 250 may include, for example, road noise, tire noise, engine noise, general wind noise, wind noise from windows being open, wind noise from a convertible top being open, radio volume level, etc. In an embodiment where audio communication device 210 is implemented in a house, for example, noise sources may include appliances, stereo equipment, etc.

In some embodiments, audio communication system parameters may be used to reduce or subtract noise that is introduced into microphones 240 by noise sources such as noise sources 250. Audio communication system parameters may include parameters for optimizing acoustic echo cancellers, equalizers, voice activity detectors, noise suppression, automatic gain control, etc.

Audio communication system parameters may be computed based on a profile of noise detected by microphones such as microphones 240. In some embodiments, a database of stored, pre-computed audio communication system parameters may be used to enhance the optimization process. The stored audio communication systems parameters may be stored, for example, in memory units 220. In some embodiments, an appropriate set of stored audio communication system parameters from the database may be used as an initial set of audio communication system parameters for the audio communication device. In some embodiments, the initial audio communication system parameters may be subsequently tweaked further using current noise profiles detected in real time for better optimization.

In some embodiments, the audio communication system parameters may be stored in correlation with associated states of the noise-related conditions. In some embodiments, the current states of noise-related conditions may be determined by monitoring sensors 265. Once the current states of noise-related conditions are determined, a search may be then performed through the database of stored states of noise-related conditions to determine a set of stored states of noise-related conditions substantially close to the current set of states. The audio communication system parameters corresponding to the stored states of noise-related conditions may then be retrieved and, in some embodiments, used as the initial audio communication system parameters for optimization.

In some embodiments, if a substantial match for the current states of the noise-related conditions is not found in the database, interpolation/extrapolation techniques may be used to determine a set of audio communication system parameters substantially corresponding to the current states of the noise-related conditions.

Figure 3:
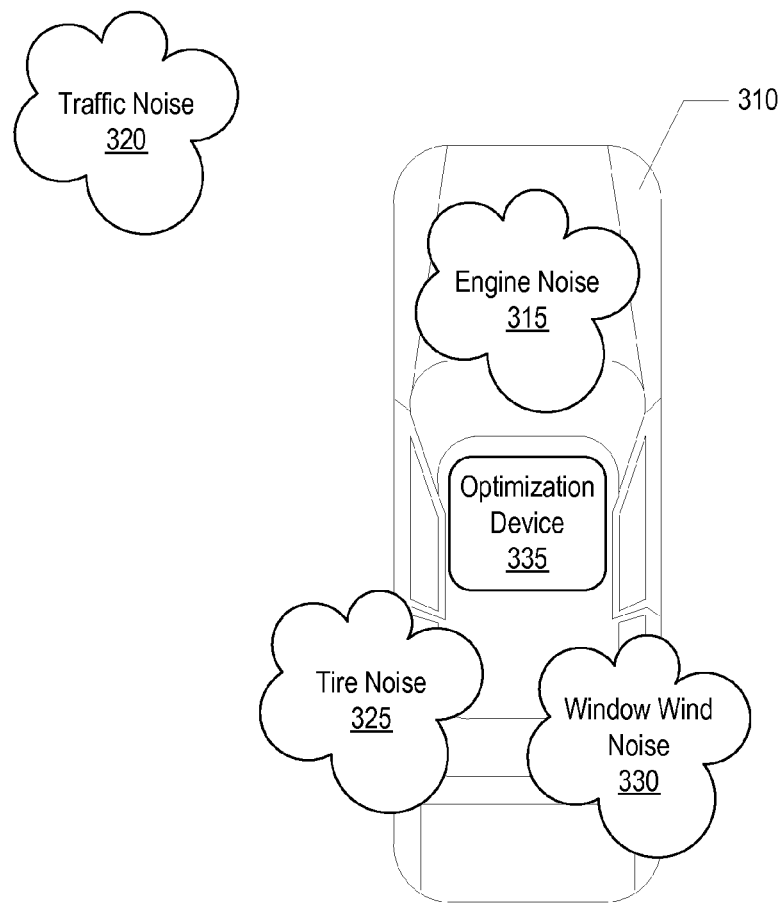
FIG. 3 is a block diagram illustrating a system for optimizing the performance of an audio communication system as the system may be used in an automobile, in accordance with some embodiments.

FIG. 3 is a block diagram illustrating a system for optimizing the performance of an audio communication system as the system may be used in an automobile, in accordance with some embodiments.

In some embodiments, optimization device 335 may be implemented in an automobile such as automobile 310. In some embodiments, optimization device 335 may be similar in functionality to audio communication system device 110.

Various noise sources can exist in an automobile environment. Examples of such sources may be traffic giving rise to traffic noise 320, rolling tires giving rise to tire noise 325, open windows giving rise to window wind noise 330, engine giving rise to engine noise 315, etc.

Figure 4:
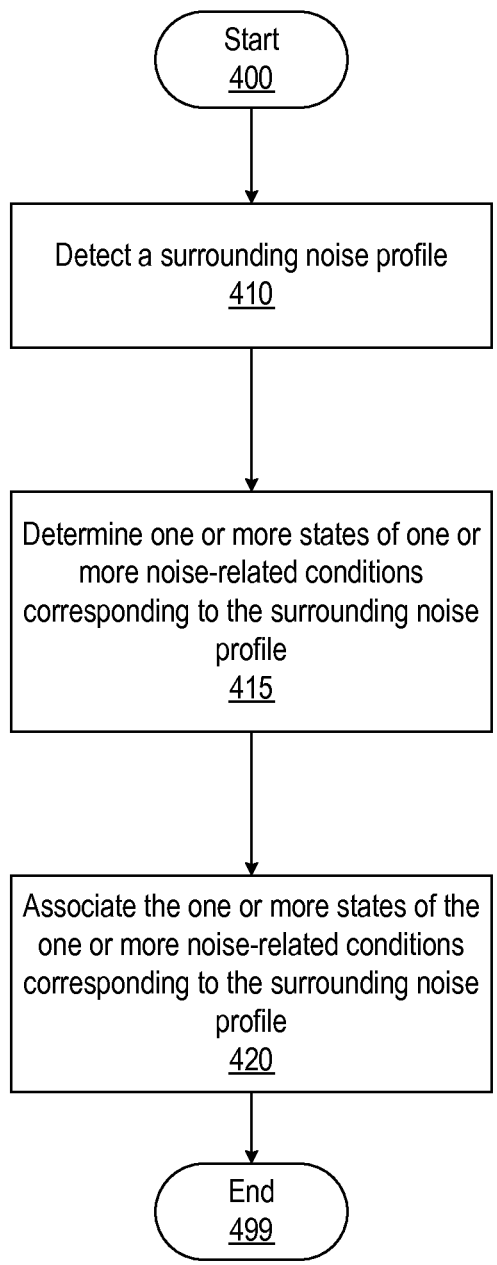
FIG. 4 is a flow diagram illustrating a method for optimizing the performance of an audio communication system, in accordance with some embodiments.

FIG. 4 is a flow diagram illustrating a method for optimizing the performance of an audio communication system, in accordance with some embodiments. In some embodiments, the methods described here may be implemented by a device such as the one described in FIG. 1.

Processing begins at 400 whereupon, at block 410, a surrounding noise profile is determined. The surrounding noise profile, in some embodiments, is a result of multiple noise sources. In some embodiments, audio communication system parameters according to an audio communication system and corresponding to the detected noise profile may be computed.

At block 415, one or more states of one or more noise-related conditions corresponding to the surrounding noise profile are determined. The states of noise-related conditions could be anything that causes or contributes to the generation of noise such as the speed of a car, the position of the window in a car, whether an appliance is switched on in a home, etc.

At block 420, the one or more states of the one or more noise-related conditions are associated to the corresponding surrounding noise profile. In some embodiment, the one or more states of the one or more noise-related conditions are also associated to the corresponding surrounding noise profile. In some embodiments, a database may be created of states of the noise-related conditions and the corresponding surrounding noise profile and/or the corresponding audio communication system parameters.

Figure 5:
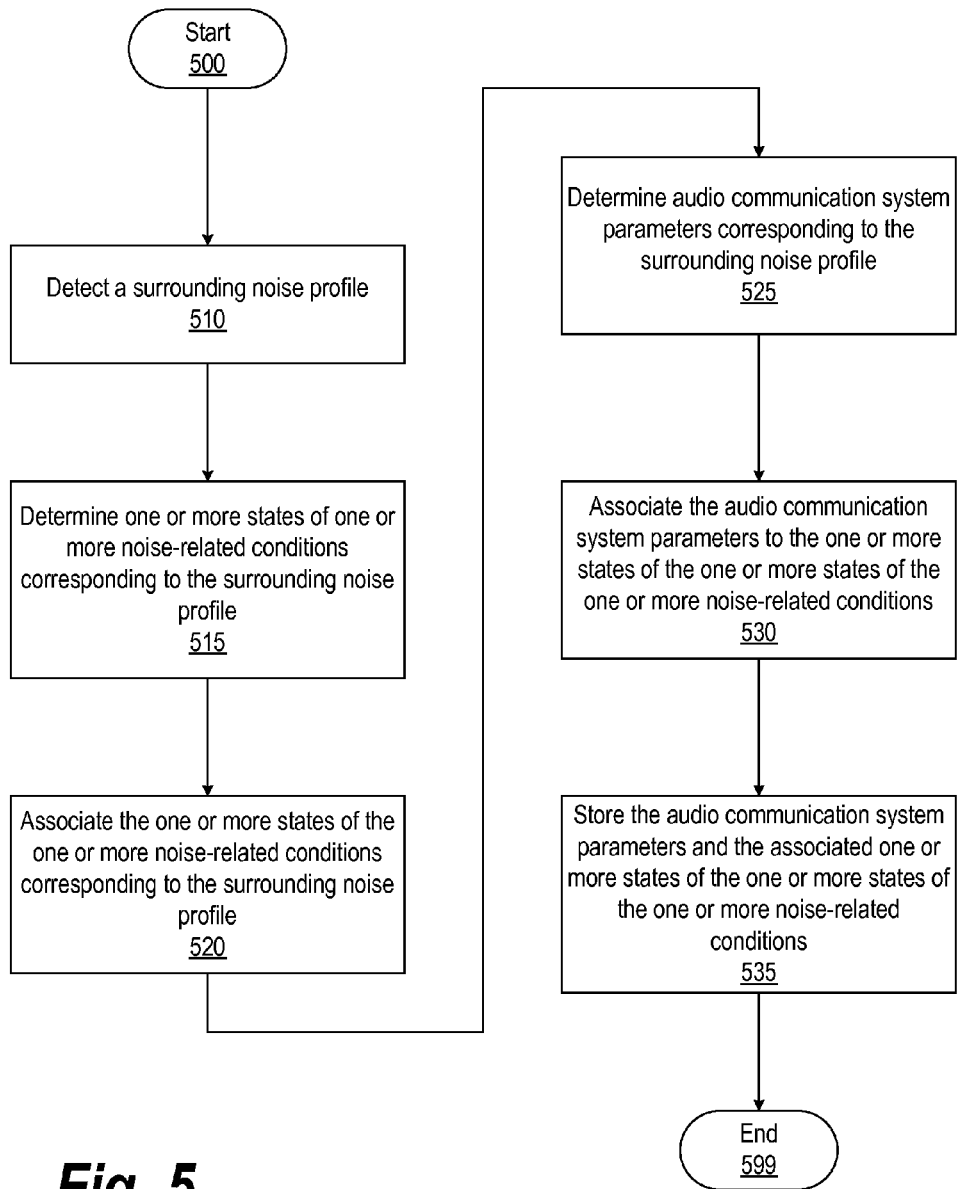
FIG. 5 is a flow diagram illustrating an alternative method for optimizing the performance of an audio communication system, in accordance with some embodiments.

FIG. 5 is a flow diagram illustrating an alternative method for optimizing the performance of an audio communication system, in accordance with some embodiments. In some embodiments, the methods described here may be implemented by a device such as the one described in FIG. 1.

Processing begins at 500 whereupon, at block 510, a surrounding noise profile is detected. The surrounding noise profile, in some embodiments, is a result of multiple noise sources. In some embodiments, microphones and corresponding hardware may be used to detect the noise profile, and an ADC may be used to convert the noise profile from analog to digital.

At block 515, one or more states of one or more noise-related conditions corresponding to the surrounding noise profile are determined. In some embodiments, the states of the noise related conditions may be anything that causes or contributes to noise, such as the speed of a vehicle, the position of a window in a vehicle, whether a home appliance is switched on, etc.

At block 520, the one or more states of the one or more noise-related conditions are associated to the corresponding surrounding noise profile. At block 525, audio communication system parameters corresponding to the surrounding noise profile are determined. In some embodiments, the audio communication system parameters may be computed according to a particular optimization method. At block 530, the audio communication system parameters are also associated to the one or more states of the one or more states of the one or more noise-related conditions.

At block 535, the audio communication system parameters and the associated one or more states of the one or more noise-related conditions are stored. In other embodiments, in addition to storing the audio communication system parameters, the surrounding noise profile may also be stored.

Processing subsequently ends at 599.

Figure 6:
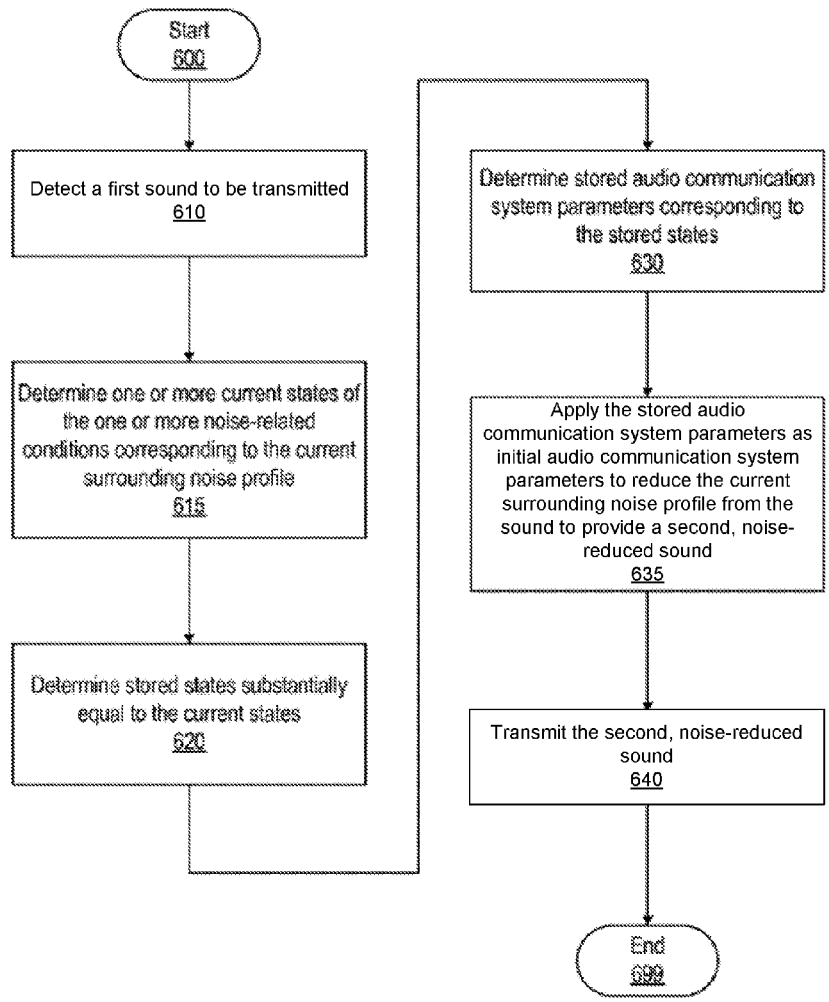
FIG. 6 is a flow diagram illustrating a method for optimizing the performance of an audio communication system for transmitting a sound, in accordance with some embodiments.

FIG. 6 is a flow diagram illustrating a method for optimizing the performance of an audio communication system for transmitting a sound, in accordance with some embodiments. In some embodiments, the methods described here may be implemented by a device such as the one described in FIG. 2.

Processing begins at 600 whereupon, at block 610, a sound, such as, for example, first sound 270, to be transmitted is detected. In some embodiments, the sound to be transmitted may be detected using one or more microphones and appropriate hardware. The detected sound may also be converted from analog to digital using an ADC converter.

At block 615, one or more current states of the one or more noise-related conditions corresponding to the current surrounding noise profile are determined. The states may be determined, for example, by monitoring one or more sensors configured to detect the states of the one or more noise-related conditions.

At block 620, stored states substantially equal to the current states are determined. In some embodiments, a search in a database may be performed to determine stored states that are substantially equal to the current set of states.

At block 630, the stored audio communication system parameters corresponding to the stored states are determined. In some embodiments, if stored states substantially equal to the current states are not found in the database, interpolation/extrapolation techniques may be used to determine the audio communication system parameters that would be a good correspondence to the current surrounding noise profile.

At block 635, stored audio communication system parameters are applied as initial audio communication system parameters to, among other things, reduce the current surrounding noise profile from the sound to provide a second, noise-reduced sound, such as, for example, second noise-reduced sound 275. In some embodiments, the stored and/or computed audio communication system parameters may be used initially and may be followed by audio communication system parameters that are calculated later using current surrounding noise profiles.

At block 640, the sound, such as, for example, the second, noise-reduced sound, is transmitted. Processing ends at 699.

Those of skill will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages that may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A method for optimizing a motor vehicle communication system, the method comprising:

detecting a first sound in the vehicle;
determining current states of a plurality of noise-related conditions of the motor vehicle;
searching a database of noise-related condition states and locating a noise-related condition state in the database that is at least substantially equal to the current states of the plurality of noise-related conditions;
obtaining from the database, audio communication system operating parameters that correspond to the noise-related condition state, and that are at least substantially equal to said current states of the plurality of noise-related conditions;
applying the audio communication system operating parameters that were obtained from the database to the audio communication system as initial audio communication system parameters, which thereby reduce noise from the first sound and to thereby provide a second, noise-reduced sound to be transmitted; and
transmitting the second, noise-reduced sound from the motor vehicle communication system;
wherein the steps of the method are performed without measuring, determining or estimating noise in the motor vehicle;
wherein the step of obtaining from the database, audio communication system operating parameters that correspond to the noise-related condition state that is at least substantially equal to said current states of the plurality of noise-related conditions, comprises: using interpolation/extrapolation techniques to determine audio communication system parameters that substantially correspond to current states of noise-related conditions.

2. The method of claim 1, wherein the step of transmitting noise-reduced detected sound comprises transmitting the second, noise-reduced sound from a transceiver using radio waves.

3. The method of claim 1, wherein determining current states of a plurality of noise-related conditions comprises monitoring sensors configured to detect at least one of: a position of a motor vehicle's window; the speed of the motor vehicle's engine; the motor vehicle's location; and the motor vehicle's speed.

4. The method of claim 1, wherein the step of detecting sound comprises detecting sound using a microphone coupled to the audio communication system and wherein the step of applying the audio communication system parameters obtained from the database comprises subtracting noise signals introduced into the microphone.

5. The method of claim 1, wherein the step of obtaining from the database, audio communication system operating parameters that correspond to the noise-related condition state that is at least substantially equal to said current states of the plurality of noise-related conditions comprises: searching a database containing a plurality of stored states of noise-related conditions and which contains stored audio communication system parameters associated with the stored states of noise-related conditions.

6. An apparatus for optimizing a motor vehicle communication system, the apparatus comprising:

a microphone configured to detect a first sound;
a plurality of sensors, each sensor configured to determine a current state of a noise-related condition of the motor vehicle;
a memory unit configured to store a database of noise-related condition states and store audio communication system operating parameters which correspond to the stored, noise-related condition states;

a transceiver configured to transmit and receive audio signals over radio waves; and a processor, which is coupled to: the memory unit, the sensors, the microphone, and the transceiver; the processor being configured to:

detect the first sound from the microphone;

determine from the plurality of sensors, current states of a plurality of noise-related conditions of the motor vehicle;

determine noise-related condition states stored in the database that are at least substantially equal to the current states of the noise-related conditions;

determine audio communication system operating parameters that are stored in the memory unit and which correspond to the noise-related condition states in the database that are substantially equal to the current states of the noise-related conditions; and apply the audio communication system parameters obtained from the database to the audio communication system as initial communication system parameters, to reduce noise from the detected first sound and thereby provide a second, noise-reduced sound to be transmitted; and cause the transmission of the second, noise-reduced sound from the transceiver;

said apparatus being configured such that it does not measure, determine or estimate noise in the motor vehicle, wherein the apparatus is configured to interpolate stored communication parameters to current states of noise-related conditions and extrapolate, stored communication parameters, to current states of noise-related conditions.

7. The apparatus of claim 6, wherein noise-related condition states are at least one of: a window position, a vehicle speed, an engine speed and a vehicle location.

8. The apparatus of claim 6, wherein the processor is configured to subtract noise introduced into the microphone, the subtracted noise being determined from current states of noise-related conditions.

9. The apparatus of claim 6, wherein the processor is configured to search a database stored in the memory unit, the database containing a plurality of stored states of noise-related conditions and corresponding audio communication system parameters associated with each noise-related condition states.

* * * * *